(12) United States Patent
Uguen

(10) Patent No.: US 6,611,904 B1
(45) Date of Patent: Aug. 26, 2003

(54) MEMORY ACCESS ADDRESS COMPARISON

(75) Inventor: Laurent Uguen, Grenoble (FR)

(73) Assignee: STMicroelectronics S.A., Gentilly (FR)

( * ) Notice: Subject to any disclaimer, the term of this patent is extended or adjusted under 35 U.S.C. 154(b) by 0 days.

(21) Appl. No.: 09/563,611

(22) Filed: May 2, 2000

(30) Foreign Application Priority Data

May 3, 1999 (EP) .............................................. 99410046

(51) Int. Cl.[7] .......................... G06F 12/00; G11C 8/00; G11C 16/04
(52) U.S. Cl. ...................... 711/163; 711/152; 711/150; 365/230.05; 365/189.04
(58) Field of Search ................................. 711/163, 150, 711/151, 152, 154, 158; 365/230.05, 195, 194, 189.04, 189.07

(56) References Cited

U.S. PATENT DOCUMENTS

| | | | |
|---|---|---|---|
| 5,276,837 A | 1/1994 | Sakaue | 395/425 |
| 5,289,427 A * | 2/1994 | Nicholes et al. | 365/230.05 |
| 5,541,887 A | 7/1996 | Dhong et al. | 365/230.05 |
| 5,717,646 A | 2/1998 | Kyi | 365/230.05 |

OTHER PUBLICATIONS

European Search Report from European Application No. 99410046.9, filed May 3, 1999.

* cited by examiner

Primary Examiner—Kimberly McLean-Mayo
(74) Attorney, Agent, or Firm—Wolf, Greenfield & Sacks, P.C.; James H. Morris; Robert A. Skrivanek, Jr.

(57) ABSTRACT

A memory system comprises a memory array having a plurality of memory locations; a plurality of write ports for writing to the memory array; write protection circuitry for preventing more than one memory location from being addressed at the same time in a write operation, the write protection circuitry providing one write enable signal for each write port, the write enable signals being applied to the memory array; and circuitry for controlling the timing of the application of the write enable signals to the memory array, the circuitry for controlling the timing being upstream of the write protection circuitry.

27 Claims, 4 Drawing Sheets

MEMORY ACCESS ADDRESS COMPARISON

FIELD OF THE INVENTION

The present invention relates to a memory system.

BACKGROUND OF THE INVENTION

Reference will first be made to FIG. 1 which schematically shows a known memory system 2. The known memory system 2 comprises a memory matrix 4 made up of a plurality of registers (not shown). Each of these registers is made up of a plurality of memory cells. The matrix 4 has four write ports 6 which can be used to write data to the registers of the matrix 4. The matrix 4 also has eight ports 8 from which data can be read. With four writing ports 6, care must be taken to ensure that two or more of the writing ports do not attempt to write to the same register at the same time. To avoid this problem in the known memory system, write protection circuitry 10 is provided.

The write protection circuitry 10 is connected to the output of an address decoder unit 12 which decodes the addresses to which each of the write ports 6 is to write. The write protection circuitry 10 compares the addresses decoded by the address decoder unit 12 and is able to identify if two or more ports 6 are to write to the same register. The output of the write protection circuitry 10 provides a write enable signal for each of the registers for each of the write ports 6. If two or more write ports 6 are addressing the same location, only one of those write ports 6 will be able to write data to its given address. The other ports 6 would be deactivated. The output of the write protection circuitry 10 is connected to the input of a latch 14 which also receives a clock signal which controls the synchronization of the write enable signals applied to the matrix. The latch is transparent when the clock is low and locked when the clock is high.

After the latch 14, the write enable signal is input to a NAND gate 15 along with the clock signal CLK in order to disactivate the write enable signals when the clock is low. The system of FIG. 1 is such that the writing operation can be carried out only when the clock is high since the write enable signals are active only at this time.

The arrangement shown in FIG. 1 is disadvantageous in that the provision of the write protection circuitry 10 upstream of the latch 14 means that unnecessary delay may be introduced, even when write protection is not required. Transitory states at the outputs of the latches may also cause the wrong output to be provided as a write enable signal.

Reference is now made to FIG. 2 which shows a known memory cell which can be used in the memory matrix shown in FIG. 1. The known memory cell comprises first and second pass gates 50 and 52 respectively. Each of the pass gates 50 and 52 comprises a first p-type transistor 54 and 56 respectively and a second n-type transistor 58 and 60 respectively. The gate of the p-type transistor 54 of the first pass gate 50 receives an inverse of a write enable control signal whilst the gate of the n-type transistor 58 of that pass gate receives the write enable control signal. Likewise, the gate 68 of the p-type transistor 56 of the second pass gate 52 receives an inverse of read enable control signal whilst gate 70 of the n-type transistor 60 receives the read enable control signal. Thus, the transistors of each pass gate 50 and 52 will either both be on when the respective control signal is high (i.e. active) or both be off when the respective control signal is low (i.e. disabled).

Connected between the first and second pass gates 50 and 52 is a latch 72 comprising first and second inverters 74 and 76 respectively. One end 78 of the latch 72 is connected directly to the first pass gate 50 whilst the other end 80 of the latch 72 is connected to the second pass gate 52 via an inverter 82. One of the inverters 76 of the latch 72 is a tristate inverter and receives the write enable control signal as a controlled input. The tristate inverter 76 is off when the write enable command is high. When the pass gate 50 is on, the voltage at point 78 is forced only by the pass gate 50 and not by the inverter 76. By using the tristate inverter, conflicts between the inverter and the pass gate 50 at the beginning of a write cycle are suppressed.

The known memory cell has a number of disadvantages. Firstly, the cell is relatively large. This is because the pass gates include p-type transistors which are relatively large compared to n-type transistors. Secondly, the memory cell requires four control lines; the write enable control line; the inverse of the write enable control line; the read enable control line; and the inverse of the read enable control line. This increases the size of the memory matrix as a whole and, in practice, it can be difficult to accommodate all of the required control lines. Additionally, there can be a problem with capacitance during the write command. The additional capacitance is caused by the tristate inverters. A write enable command sees the capacitance of the pass gates, of two transistors (one n-transistor, one p-transistor) for each of the tristate inverters and the capacitance of the line joining all these points.

SUMMARY OF THE INVENTION

It is an aim of embodiments of the present invention to provide write protection circuitry which addresses the problems of the prior art.

According to one aspect of the present invention, there is provided a memory system comprising a memory array having a plurality of memory locations; a plurality of write ports for writing to said memory array; write protection circuitry for preventing more than one memory location from being addressed at the same time in a write operation, said write protection circuitry providing write enable signal for each write port, said write enable signals being applied to said memory array; and circuitry for controlling the timing of the application of the write enable signals to said memory array, said circuitry for controlling said timing being upstream of said write protection circuitry.

As a circuitry for controlling the timing of the application of the write enable signals is upstream of the write protection circuitry, there would be no effect on the performance of the memory system if write protection is not required. By providing the write protection before the latches as in the prior art, unnecessary delays occur even when write protection is not needed. This loss of timing is prevented by embodiments of the invention where the write protection is downstream of the latches. It is preferred that the output of the write protection circuitry be directly applied to the memory array. Putting the write protection circuitry as the last stage before the memory array protects the circuit from any transitory state at the outputs of the latches. Since it is the ultimate combination of the write enable signals which controls the writing operation, the protection is effective.

The write protection circuitry may be arranged to assign a hierarchy to said write ports. For example, n write ports may be provided and the first write port may have priority over the remaining n−1 ports and the nth port may have the lowest priority.

The write enable signals output by the write protection circuitry may be low when active and high when disabled.

In other embodiments of the invention, the write enable signals may be high when active and low when disabled. The write enable signals are preferably always deactivated for one half of the clock cycle. This means delays will only occur if write protection is needed. When write protection is not needed, no electrical transition resulting in a delay occurs in the write protection circuitry. The number of write enable signals may be equal to the number of write ports multiplied by the number of memory locations. The write protection circuitry may be arranged to receive a plurality of signals indicative of the address of at least one memory location. These signals may be high when active and low when disabled.

The number of addresses may be equal to the number of ports. An address decoder may be provided. The address decoder may be arranged to receive a plurality of addresses corresponding to the respective write ports. The address decoder may provide the plurality of signals which are received by said write protection circuitry. The circuitry for controlling the timing may be coupled between the address decoder and said write protection circuitry.

A plurality of write protection circuits may be provided, the number of write protection circuits being equal to the number of locations in the memory. The locations in the memory may comprise registers.

The memory array may comprise a plurality of cells, each said cell comprising data write circuitry, memory circuitry and data read circuitry. The memory circuitry may comprise a latch. That latch may comprise two inverters. The memory circuitry may be arranged between the data write circuitry and the data read circuitry. The data read circuitry may comprise a pass gate controlled by a read control signal and its inverse. The data write circuitry may comprise three transistors of the same conductivity type controlled by a single control signal. The transistors may be field effect transistors and the conductivity type may be n type. The single control signal may be the write enable signals provided by the write protection circuitry.

A first of the transistors may be connected between a data input and the memory circuitry, a second of said transistors may be connected between the read side of the memory circuitry and the third transistor, the other end of the third transistor being connected to a voltage supply. That voltage supply may be ground. The first and second transistors may receive said control signal at the control input thereof. In other words, said transistors may receive said control signal at the gates thereof.

According to another aspect of the present invention, there is provided an integrated circuit comprising a memory system such as discussed hereinbefore.

BRIEF DESCRIPTION OF THE DRAWINGS

For a better understanding of the present invention and as to how the same may be carried into effect, reference will now be made by way of example to the accompanying drawings in which.

DETAILED DESCRIPTION OF EMBODIMENTS OF THE INVENTION

Figure 3:
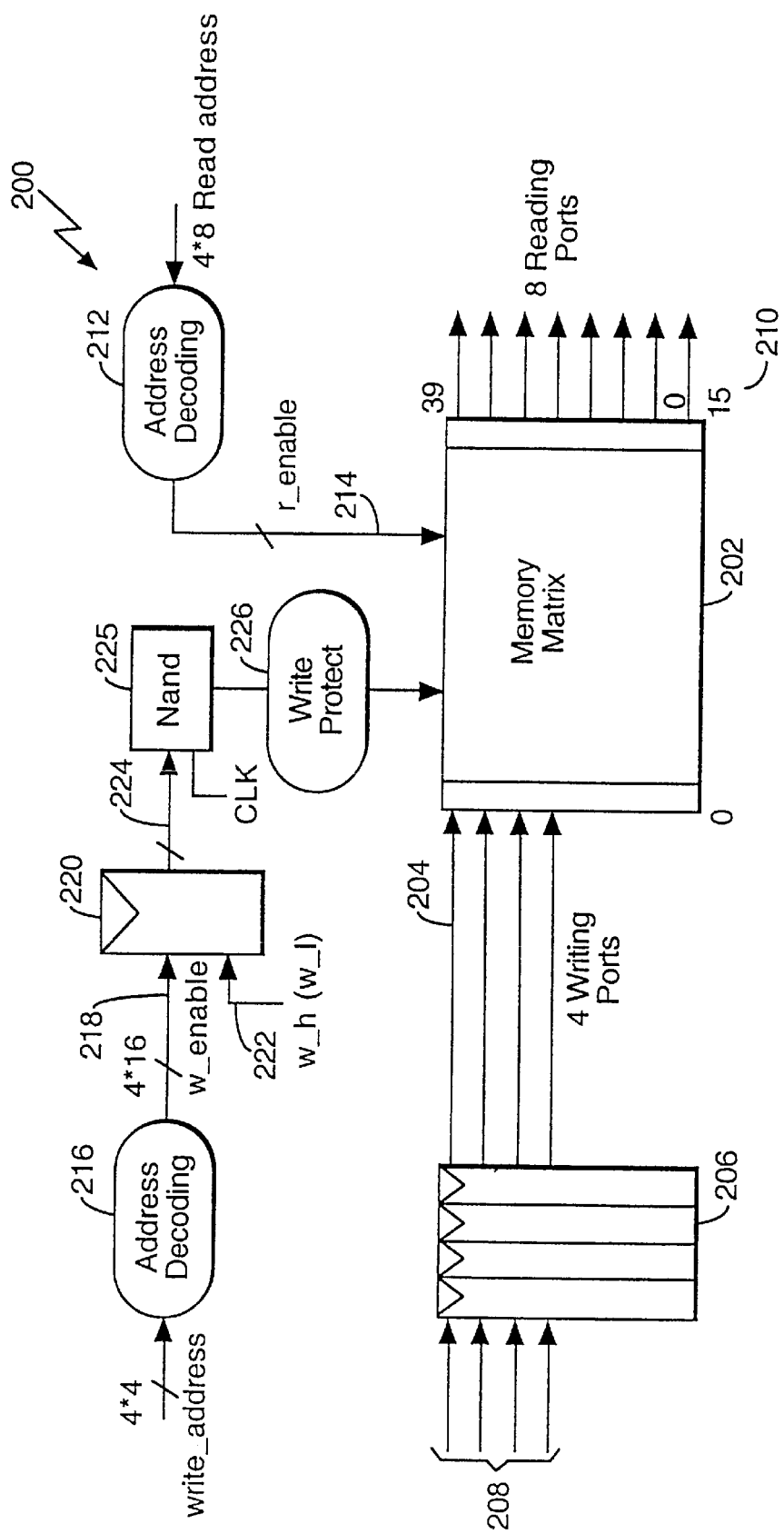
FIG. 3 shows a schematic overview of embodiments of the present invention.

Reference will now be made to FIG. 3 which shows a memory system 200 embodying the present invention. The memory system 200 comprises a memory matrix 202. The memory matrix 202 comprises sixteen registers each having 40 bits. The memory matrix 202 has four write ports 204 which are able to write to the registers. In embodiments of the present invention, the twenty four most significant bits are written into a register separately from the associated sixteen at least significant bits. The data to be written into the registers via the four write ports 204 are stored in buffers 206. The presence of four different write ports 204 mean that different registers can be written to at the same time. One buffer is provided for each write 204 port. The buffers 206 are flip-flops.

The memory matrix 202 also has eight read ports 210 for reading data from the respective different registers at the same time. The memory system 200 has a read address decoder 212. The read address decoder 212 receives eight addresses. Each address is four bits long and will specify one of the registers of the memory matrix 202. The read address decoder 212 provides appropriate read enable signals via output 214 to the memory matrix 202 to allow the contents of the appropriate register to be read and output on the appropriate read port 210.

The memory system 200 also has a write address decoder 216. The write address decoder 216 is arranged to receive four addresses, one for each of the write ports 204. Each address is again four bits long and specifies one of the sixteen registers of the memory matrix 202. These addresses are decoded by the address decoder 216 and output via output 218 to latch circuitry 220. The signals from the latch circuitry 220 are input to NAND gate circuitry 225 along with a clock signal clk. When the clock is low, a deactivated output is provided by the NAND gate circuitry. The output of the NAND gate circuitry is the inverse of the write enable command. The write signal output by the NAND gate circuitry is low if a write operation is to be performed and high if a write operation is not to be performed or if the clock signal is low.

The output of the NAND gate circuitry 225 is input to write protection circuitry 226 which ensures that no two ports are writing to the same address. The output of the write protection circuit 26 provides write enable signals so that the respective registers are enabled to permit data from the respective write port 204 to be written thereto. The write protection circuit 226 inverts the signals received from the NAND gate circuitry 225 so that the write enable signal is high if a write operation is to be performed and low if a write operation is not to be performed.

Figure 4:
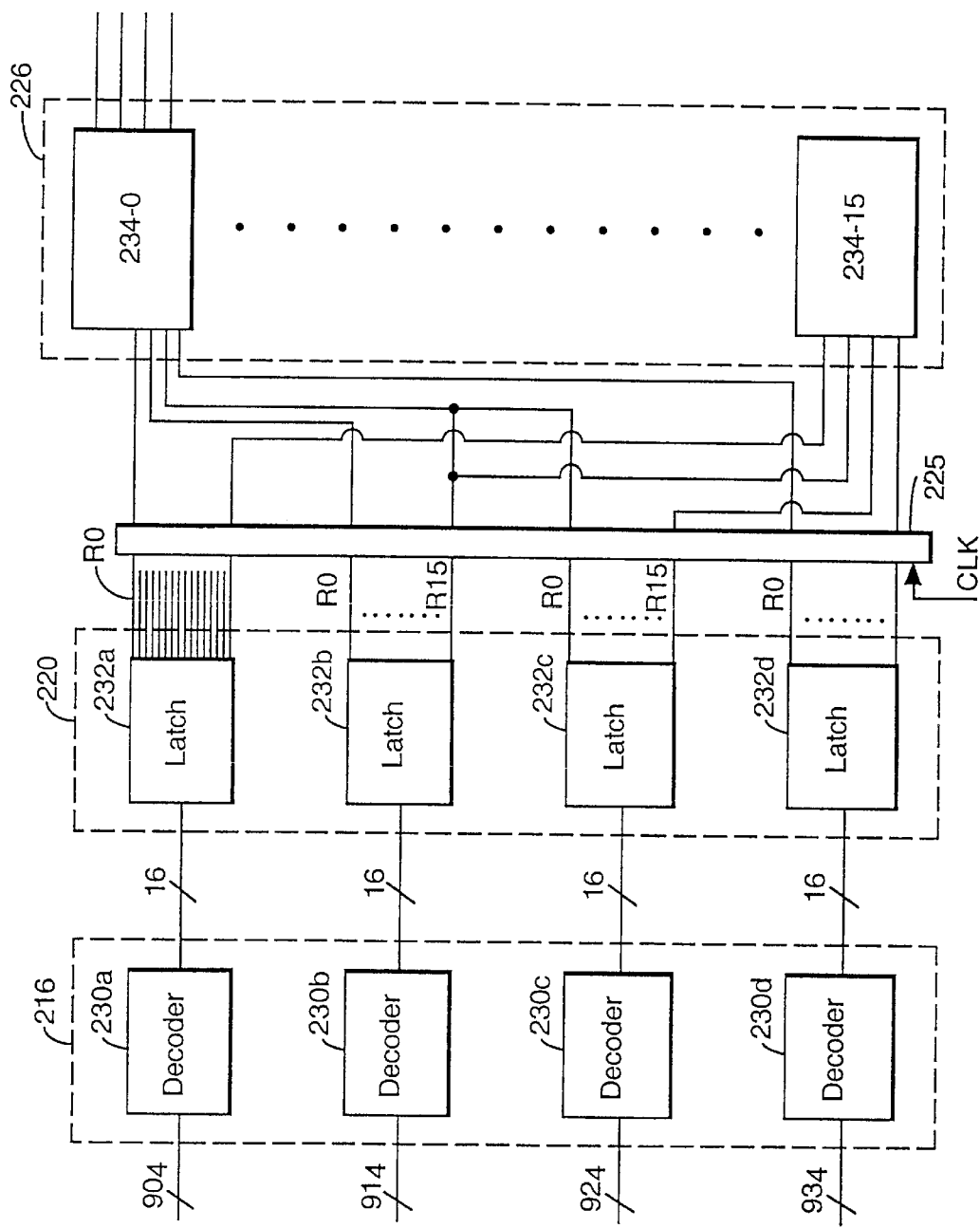
FIG. 4 shows a detailed view of part of the memory system of FIG. 3.

Reference will now be made to FIG. 4 which shows part of the system of FIG. 3 in more detail. The address decoder 216 is arranged to receive four addresses A0, A1, A2 and A3, one for each of the respective write ports 204. Each address is four bits long and specifies one of the sixteen registers. Each address A0–A3 is input to a respective decoder 230a–d. Each decoder 230 decodes the respective address to provide sixteen write enable signals. All but one of the write enable signals will be high and one will be low. The sixteen write enable signals from each decoder correspond to the sixteen registers. Thus, the single write enable signal of a given address which is low is associated with the register to which a given write port 204 is to write data.

The sixteen outputs of each decoder 230a–d are input to the latch circuitry 220. The latch circuitry 220 comprises four latch units 232a–d. Each unit 232a–d comprises sixteen latches, one for each write enable signal received from the respective decoder 230. Each latch unit 232a–d therefore provides sixteen outputs R0–R15. The first output of each latch unit 232a–d is input to a first write protect block 234-0. Likewise, the second output R1 of each latch unit is input to a second write protection unit 234-1 and so on. The last output of each latch unit 232a–d, R15 is input to the sixteenth write protection unit 234-15. The sixteen write protection units constitute the write protection circuitry 226. It should be noted that NAND gate circuitry 225 is provided between the output of the latch circuitry 220 and the input of the write protection circuitry 226. The NAND gate circuitry has two functions:

a) invert the output of the latch circuitry 220 when the clock signal is high;

b) provide an inactive signal when the clock signal is low, regardless of the output of the latch circuitry;

The construction of each write protection unit 234 circuit will now be discussed in relation to FIG. 5. In this embodiment, the first write port has priority over the second write port which has priority over the third write port which has priority over the fourth write port. As discussed in relation to FIG. 4, each write protection unit 234 has four inputs 236, 238, 240 and 242. Each input comes from a respective different one of the latch units 232a–d if a write port is to be written to, the signal received at the input will be low and high if the write port in question is not to be written to. It should be noted that the write protection circuitry performs an inverting operation so that a high active write enable signal is output by the write protection circuitry. The first input w0 236 which corresponds to one of the write enable signals for the first write port 204 is connected to a first buffer 244 and a first inverter 246. The first buffer 244 and the first inverter 246 are connected in series. The output of the first inverter 246 provides the write enable output w0-en for the first writing write port W0 for the nth registers. The output of the first inverter 246 is output to the memory matrix 202 via output 228. The first input 236 is also input to a second inverter 248 and first and second NAND gates 250 and 252 respectively. The second inverter 248 and the first and second NAND gates 250 and 252 are all in parallel with one another as well as in parallel with the first inverter 246 and buffer 244.

The second input 238 associated with the second writing port W1 is connected to a first OR gate 254. The second input to the first OR gate 254 is provided by the output of the second inverter 248. The output of the first OR gate 254 is connected to the input of a third inverter 256. The output of the third inverter 256 provides the write enable output w1-en for the nth register for the second write port W1 and is output to the memory matrix 202 via output 228. The second input 238 is also connected to the input of the first and second NAND gates 250 and 252.

The third input 240 which corresponds to the third writing port W2 is connected to a second OR gate 258. The second input to the second OR gate 258 is provided by the output of the first NAND gate 250. The output of the second OR gate 258 is connected to the input of a fourth inverter 260. The output of the fourth inverter 260 provides the write enable output w2-en for the nth register for the third write port W2 and is again output to the memory matrix via output 228. The third input 240 is also connected to the input of the second NAND gate 252.

The fourth input 242 which corresponds to the fourth write port W3 is connected to a third OR gate 262. The second input to the third OR gate 262 is provided by the output of the second NAND gate 252. The output of the third OR gate 262 is connected to the input of a fifth inverter 264. The output of the fifth inverter 264 provides the write enable output w3-en for the nth register for the fourth write port W3 and is again output to the memory matrix 202 via output 228.

Figure 5:
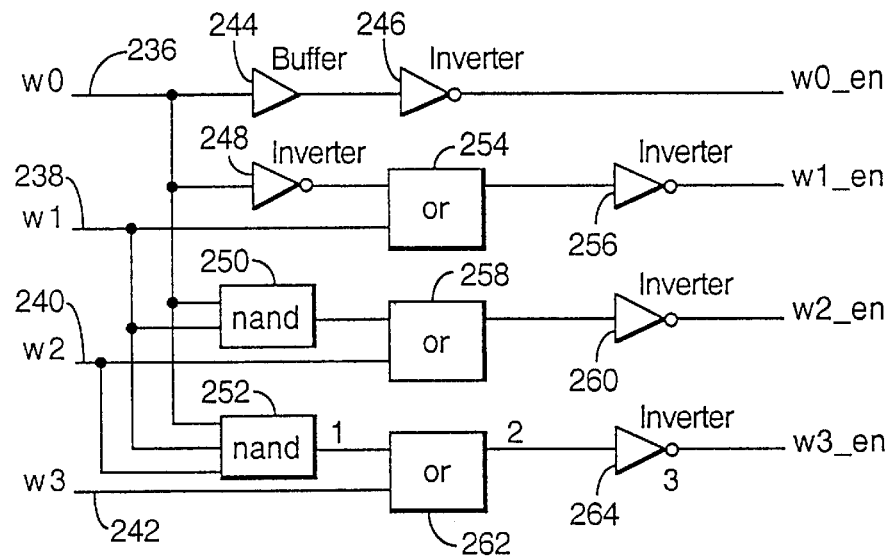
FIG. 5 shows in detail the write protection circuitry of FIG. 3.

As can be appreciated, one of the circuits shown in FIG. 5 will be provided for each of the sixteen registers.

The operation of the write protect unit 234 will now be described. If there is a conflict between two or more write ports, more than one of the inputs 236 to 242 of a given write protect unit will be one.

A truth table for the circuit shown in FIG. 5 is below.

| w0 | w1 | w2 | w3 | $w_0$-en | $w_1$-en | $w_2$-en | $w_3$-en |
|----|----|----|----|----------|----------|----------|----------|
| 0 | 0 | 0 | 0 | 1 | 0 | 0 | 0 |
| 0 | 0 | 0 | 1 | 1 | 0 | 0 | 0 |
| 0 | 0 | 1 | 0 | 1 | 0 | 0 | 0 |
| 0 | 0 | 1 | 1 | 1 | 0 | 0 | 0 |
| 0 | 1 | 0 | 0 | 1 | 0 | 0 | 0 |
| 0 | 1 | 0 | 1 | 1 | 0 | 0 | 0 |
| 0 | 1 | 1 | 0 | 1 | 0 | 0 | 0 |
| 0 | 1 | 1 | 1 | 1 | 0 | 0 | 0 |
| 1 | 0 | 0 | 0 | 0 | 1 | 0 | 0 |
| 1 | 0 | 0 | 1 | 0 | 1 | 0 | 0 |
| 1 | 0 | 1 | 0 | 0 | 1 | 0 | 0 |
| 1 | 0 | 1 | 1 | 0 | 1 | 0 | 0 |
| 1 | 1 | 0 | 0 | 0 | 0 | 1 | 0 |
| 1 | 1 | 0 | 1 | 0 | 0 | 1 | 0 |
| 1 | 1 | 1 | 0 | 0 | 0 | 0 | 1 |
| 1 | 1 | 1 | 1 | 0 | 0 | 0 | 0 |

As can be seen, on the input side, a low signal indicates that the register associated with that write protection unit 234 is to be enabled. The write enable signal output by the write protection unit 234 is high if a register is to be enabled or low if a particular register is not to be enabled. As can be seen from the truth table, where more than one register is initially set to be written to, only one of those registers in fact receives an active (high) write enable signal. This is determined by the hierarchy of the system. Accordingly, the first write port has priority over the second write port which has priority over the third write port which has priority over the fourth write port. For example if the second and third inputs 238 and 240 receive a high input, only the second output w1-en will be low.

As an example, consider the fourth input 242. The first, second or third input 236, 238 or 240 is at a low level, (i.e. representing an active signal), the second NAND gate 252 has its output at high level, the third OR gate 262 has its output at a high level and the output of the fifth inverter 264 is low, whatever the value at the fourth input 24. If the first, second and third inputs are high, (i.e. representing inactive signals) then the output of the fifth inverter 264 is the inversed value at the fourth input 242.

Consider again the fourth input 242. The commands are disactivated during the half cycle when the clock is low; it means that all four inputs 236 to 242 are at high level. During the following half cycle when the clock is high, the second NAND gate 252 will see an electrical transition only if one of the first to third inputs is low, in other words when write protection is needed. If none of these inputs has a low value, the second NAND gate 252 does not see any electrical transition, and the path from the input to the output consists of two gates (the second OR gate 262 and the fifth inverter 264). This is equivalent to the normal buffering of the command. By implementating the protection after the latches and the NAND gate circuitry 225, it is possible to avoid any unnecessary delay which might otherwise have occurred with the write protection circuitry.

As can be seen from FIG. 3, there is no further circuitry between the write protection circuitry and the memory array.

Figure 1:
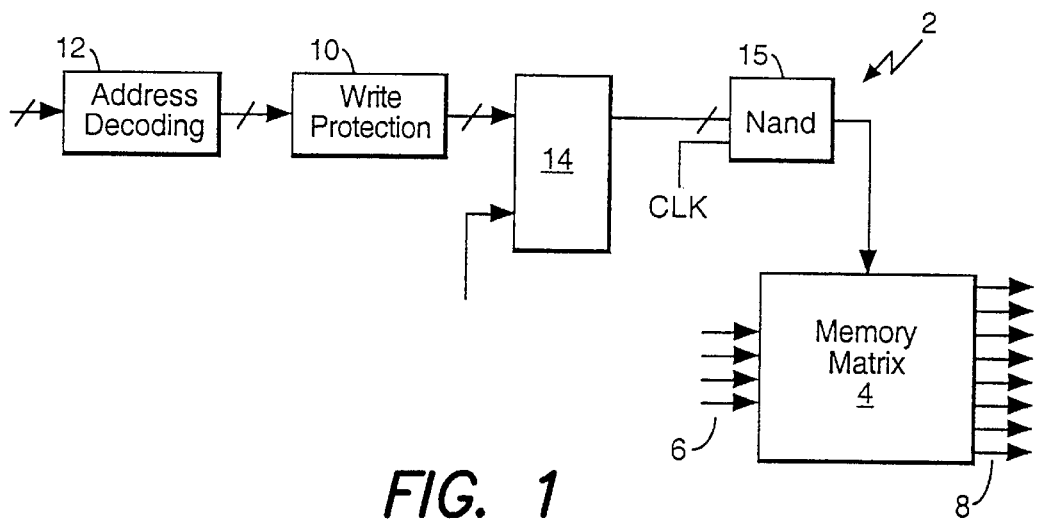
FIG. 1 shows a known memory system.
Figure 2:
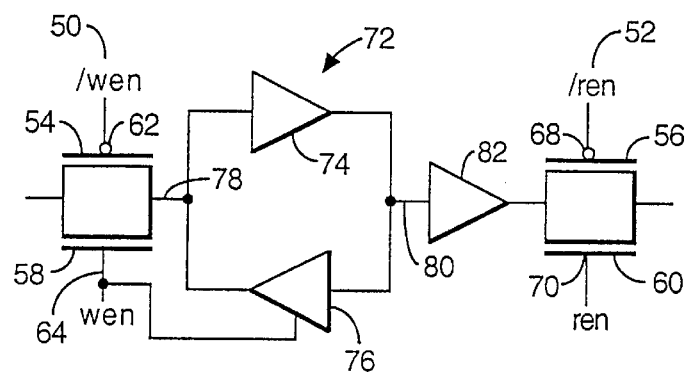
FIG. 2 shows a known memory cell.
Figure 6:
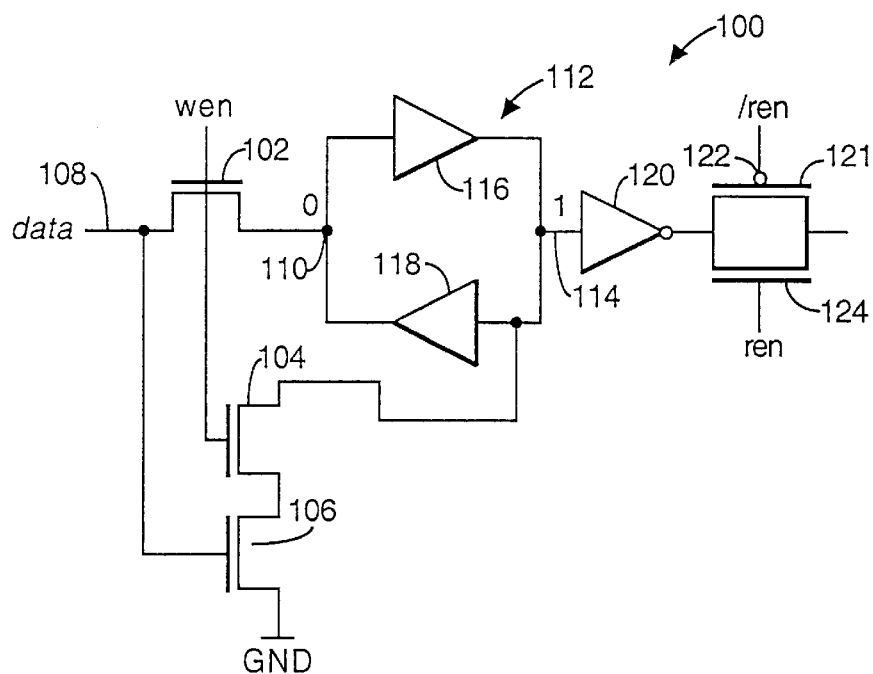
FIG. 6 shows a memory cell embodying the present invention.

Reference will now be made to FIG. 6 which shows a memory cell embodying the present invention. This cell can be used in the memory matrix of FIG. 3. The cell 100 comprises first, second and third transistors 102, 104 and 106 respectively which replace the pass gate of the known memory cell shown in FIG. 2. The first to third transistors 102 to 106 are of the same conductivity type and in preferred embodiments of the present invention are n-type field effect transistors.

The first transistor 102 is connected between an input 108 for the data to be written into the cell and an input side 110 of a latch 112 which will store the data written to the cell. The gate of the first transistor 102 is connected to a write enable control signal. The second transistor 104 is connected between the opposite, i.e. output, side 114 of the latch 112 and the third transistor 106. The gate of the second transistor 104 receives the write enable control, signal. The third transistor 106 is connected between the second transistor 104 and ground. The gate of the third transistor 106 receives the data to be written into the cell.

The latch 112 is a conventional latch and has first and second inverters 116 and 118. It should be noted that unlike the prior art, neither of these inverters is a tristate inverter. The output side of the latch 112 is connected to a further inverter 120. The output of the further inverter 120 is connected to one (the input) side of a pass gate 121 which comprises a p-type transistor 122 and a n-type transistor 124. The gate of the p-type transistor 122 receives the inverse of the read enable control signal whilst the gaze of the n-type transistor 124 receives the read enable control signal. The output side of the pass gate 121 is connected to the read port.

It should be appreciated that all of the transistors shown in the memory cell of FIG. 6 are field effect transistors.

When data is to be written to the memory cell, the first and second transistors 102 and 104 are switched on by the high write enable signal and the third transistor 106 will also be switched on if the data is a 1 to be written into the memory cell. If the data is a 1, the output side of the latch 114 is pulled to ground by the second and third transistors and this is re-enforced by the invertors 118 and 116. This means that transition of the inverter 118 is made easier since its input is pulled down by the second and third transistors 104 and 106. Therefore the electrical conflict of the prior art is resolved since both the inverter 102 and the inverter 118 drive the same value at the relevant node.

With the embodiment shown in FIG. 6, the tristate inverter required by the prior art is not required as the size of the inverter in question is not critical. This is a consequence of the second and third transistors pulling the input side of the second inverter 118 to ground during writing.

In other embodiments of the invention, the write enable signal may be low in its active state.

In alternative embodiments, the first to third transistors may be p-type transistors. It is also possible in some embodiments of the present invention that the first to third transistors are bipolar transistors.

What is claimed is:

1. A memory system comprising:
   a memory array having a plurality of memory locations;
   a plurality of write ports for writing to said memory array;
   write protection circuitry for preventing more than one memory location from being addressed at the same time in a write operation, said write protection circuitry providing a write enable signal for each write port, said write enable signal for each write port being applied to said memory array;
   circuitry for controlling timing of the application of the write enable signal for each write port to said memory array, said circuitry for controlling said timing being upstream of said write protection circuitry; and
   address decoding circuitry for decoding an address of at least one memory location to be written;
   wherein said circuitry for controlling the timing is coupled between said address decoder and said write protection circuitry.

2. A memory system as claimed in claim 1, wherein the write enable signal for each write port is arranged to be active only when a clock signal is in a first state and is arranged to be disabled when said clock signal is in a second, different state.

3. A memory system as claimed in claim 1, wherein said write protection circuitry is arranged to assign a hierarchy to said plurality of write ports.

4. A memory system as claimed in claim 3, wherein n write ports are provided and a first write port has priority over remaining n−1 ports and a nth port has a lowest priority.

5. A memory system as claimed in claim 1, wherein the write enable signal for each write port output by said write protection circuitry is high when active and low when disabled.

6. A memory system as claimed in claim 1, wherein a number of write enable signals is equal to a number of write ports multiplied by a number of memory locations.

7. A memory system as claimed in claim 1, wherein the write protection circuitry is arranged to receive a plurality of signals indicative of an address of at least one memory location.

8. A memory system as claimed in claim 7, wherein a number of addresses is equal to a number of ports.

9. A memory system as claimed in claim 1, wherein said address decoding circuitry is arranged to receive a plurality of addresses corresponding to the plurality of write ports.

10. A memory system as claimed in claim 9, wherein a number of write enable signals is equal to the number of write ports multiplied by a number of memory locations, said address decoding circuitry providing the plurality of signals which are received by said write protection circuitry.

11. A memory system as claimed in claim 1, wherein the write protection circuitry includes a plurality of write protection circuits, a number of write protection circuits being equal to a number of locations in said memory array.

12. A memory system as claimed in claim 1, wherein the plurality of memory locations in said memory array comprise registers.

13. A memory system as claimed in claim 12, wherein said memory array comprises a plurality of cells, each of the plurality of cells comprising data write circuitry, memory circuitry and data read circuitry.

14. A memory system as claimed in claim 13, wherein said memory circuitry comprises a latch.

15. A memory system as claimed in claim 13, wherein said data read circuitry comprises a pass gate controlled by a read control signal and its inverse.

16. A memory system as claimed in claim 13, wherein said data write circuitry comprises first, second and third transistors of a same conductivity type and wherein the first and second transistors are controlled by a single control signal.

17. A memory system as claimed in claim 16, wherein the first transistor is connected between a data input and a write side of said memory circuitry, the second transistor is connected between a read side of said memory circuitry and the third transistor, and the third transistor is connected between the second transistor and a voltage supply.

18. A memory system as claimed in claim 17, wherein said first and second transistors receive said single control signal at a control input thereof.

19. A memory system as claimed in claim 16, wherein the third transistor is arranged to receive data to be written to said memory circuitry at a control input thereof.

20. The memory system of claim 1, wherein the memory array includes a plurality of memory cells, each of the plurality of memory cells including data write circuitry to receive a single data signal from each of the plurality of write ports and said write enable signal for each write port.

21. The memory system of claim 20, wherein said write protection circuitry is arranged to assign a hierarchy to said plurality of write ports.

22. The memory system of claim 21, wherein n write ports are provided and a first write port has priority over remaining n−1 ports and a nth port has a lowest priority.

23. The memory system of claim 20, wherein the write enable signal for each write port output by said write protection circuitry is high when active and low when disabled.

24. A memory system comprising:
   a memory array having a plurality of memory locations;
   a plurality of write ports for writing to said memory array;
   write protection circuitry for preventing more than one memory location from being addressed at the same time in a write operation, said write protection circuitry providing a write enable signal for each write port, said write enable signal for each write port being applied to said memory array; and
   circuitry for controlling timing of the application of said write enable signal for each write port to said memory array, said circuitry for controlling said timing being upstream of said write protection circuitry;
   wherein the write protection circuitry is arranged to receive a plurality of signals indicative of an address of at least one memory location, a number of addresses being equal to a number of ports; and
   wherein an address decoder is provided and said circuitry for controlling the timing is coupled between said address decoder and said write protection circuitry.

25. An integrated circuit comprising a memory system comprising:
   a memory array having a plurality of memory locations;
   a plurality of write ports for writing to said memory array;
   write protection circuitry for preventing more than one memory location from being addressed at the same time in a write operation, said write protection circuitry providing one write enable signal for each write port, said write enable signal for each write port being applied to said memory array;
   circuitry for controlling the timing of the application of the write enable signal for each write port to said memory array, said circuitry for controlling said timing being upstream of said write protection circuitry; and
   address decoding circuitry for decoding the address of at least one memory location to be written;
   wherein said circuitry for controlling the timing is coupled between said address decoder and said write protection circuitry.

26. The integrated circuit of claim 25, wherein the write enable signal for each write port is arranged to be active only when a clock signal is in a first state and is arranged to be disabled when said clock signal is in a second, different state.

27. The integrated circuit of claim 25, wherein the memory array includes a plurality of memory cells, each of the plurality of memory cells including data write circuitry to receive a single data signal from each of the plurality of write ports and said write enable signal for each write port.

* * * * *